(12) United States Patent
Stevanovic et al.

(10) Patent No.: US 7,353,859 B2
(45) Date of Patent: Apr. 8, 2008

(54) HEAT SINK WITH MICROCHANNEL COOLING FOR POWER DEVICES

(75) Inventors: Ljubisa Dragoljub Stevanovic, Clifton Park, NY (US); Stephen Adam Solovitz, Croton on Hudson, NY (US)

(73) Assignee: General Electric Company, Niskayuna, NY (US)

( * ) Notice: Subject to any disclaimer, the term of this patent is extended or adjusted under 35 U.S.C. 154(b) by 120 days.

(21) Appl. No.: 10/998,707

(22) Filed: Nov. 24, 2004

(65) Prior Publication Data

US 2006/0108098 A1    May 25, 2006

(51) Int. Cl.
H05K 7/20 (2006.01)
(52) U.S. Cl. .............. 165/80.4; 165/170; 257/714; 361/699
(58) Field of Classification Search .......... 165/80.4, 165/170; 257/714; 361/699
See application file for complete search history.

(56) References Cited

U.S. PATENT DOCUMENTS

| 4,573,067 | A | * | 2/1986 | Tuckerman et al. | 257/714 |
| 4,758,926 | A | * | 7/1988 | Herrell et al. | 361/699 |
| 4,759,403 | A | * | 7/1988 | Flint et al. | 165/80.4 |
| 5,016,090 | A | * | 5/1991 | Galyon et al. | 257/714 |
| 5,345,107 | A | | 9/1994 | Daikoku et al. | |
| 5,388,635 | A | * | 2/1995 | Gruber et al. | 165/80.4 |
| 5,453,641 | A | * | 9/1995 | Mundinger et al. | 257/714 |
| 5,692,558 | A | | 12/1997 | Hamilton et al. | |
| 5,727,618 | A | | 3/1998 | Mundinger et al. | |
| 5,892,279 | A | * | 4/1999 | Nguyen | 257/714 |
| 5,998,240 | A | | 12/1999 | Hamilton et al. | |
| 6,014,312 | A | | 1/2000 | Schulz-Harder et al. | |
| 6,129,145 | A | * | 10/2000 | Yamamoto et al. | 361/699 |
| 6,131,650 | A | | 10/2000 | North et al. | |
| 6,188,575 | B1 | * | 2/2001 | Azotea | 361/701 |
| 6,344,686 | B1 | * | 2/2002 | Schaeffer et al. | 257/714 |
| 6,449,158 | B1 | * | 9/2002 | Wang et al. | 361/704 |
| 6,529,394 | B1 | | 3/2003 | Joseph et al. | |
| 6,678,182 | B2 | | 1/2004 | Joseph et al. | |

(Continued)

FOREIGN PATENT DOCUMENTS

EP    1049161    11/2000

OTHER PUBLICATIONS

PCT Search Report, PCT/US2005/041087, Nov. 27, 2006.

*Primary Examiner*—Leonard R Leo
(74) *Attorney, Agent, or Firm*—Penny A. Clarke; Patrick K. Patnode

(57) ABSTRACT

An apparatus for cooling at least one heated surface includes a base plate defining a number of inlet and outlet manifolds. The inlet manifolds are configured to receive a coolant, and the outlet manifolds exhaust the coolant. The inlet and outlet manifolds are interleaved. The apparatus also includes at least one substrate having inner and outer surfaces. The inner surface is coupled to the base plate and defines a number of microchannels that receive the coolant from the inlet manifolds and deliver the coolant to the outlet manifolds. The microchannels are oriented substantially perpendicular to the inlet and outlet manifolds. The outer surface is in thermal contact with the heated surface. The apparatus also includes an inlet plenum that supplies the coolant to the inlet manifolds, and an outlet plenum that exhausts the coolant from the outlet manifolds. The inlet plenum and outlet plenum are oriented in a plane of the base plate.

31 Claims, 15 Drawing Sheets

U.S. PATENT DOCUMENTS 7,032,651 B2 * 4/2006 Winslow et al. ........... 165/80.4
2003/0066634 A1 4/2003 Valenzuela et al.
2004/0022691 A1 * 2/2004 Allen et al. ................. 422/102
2006/0113063 A1 * 6/2006 Chordia et al. ............ 165/80.4

* cited by examiner

HEAT SINK WITH MICROCHANNEL COOLING FOR POWER DEVICES

CROSS REFERENCE TO RELATED APPLICATIONS

This application is related to commonly assigned, copending U.S. patent application No. 10/998,798, now U.S. Pat. No. 7,327,024 entitled "Power module, phase leg, and three-phase inverter," Stevanovic et al., filed concurrently herewith, which patent application is incorporated by reference herein in its entirety.

BACKGROUND

The invention relates generally to an apparatus for cooling a heated surface and, more particularly, to a heat sink with microchannel cooling for semiconductor power devices.

The development of higher-density power electronics has made it increasingly more difficult to cool power semiconductor devices. With modern silicon-based power devices capable of dissipating up to 500 W/cm$^2$, there is a need for improved thermal management solutions. When device temperatures are limited to 50 K increases, natural and forced-air cooling schemes can only handle heat fluxes up to about one (1) W/cm$^2$. Conventional liquid cooling plates can achieve heat fluxes on the order of a twenty (20) W/cm$^2$. Heat pipes, impingement sprays, and liquid boiling are capable of larger heat fluxes, but these techniques can lead to manufacturing difficulties and high cost.

An additional problem encountered in conventional cooling of high heat flux power devices is non-uniform temperature distribution across the heated surface. This is due to the non-uniform cooling channel structure, as well as the temperature rise of the cooling fluid as it flows through long channels parallel to the heated surface.

One promising technology for high performance thermal management is microchannel cooling. In the 1980's, it was demonstrated as an effective means of cooling silicon integrated circuits, with designs demonstrating heat fluxes of up to 1000 W/cm$^2$ and surface temperature rise below 100° C.

Other micro-channel heat sink designs also demonstrate similar thermal performance. Published US Patent Application No. 20030066634A1, Valenzuela et al., entitled "Heat Exchanger," provides an improvement relative to conventional liquid cooling designs. The device of Valenzuela et al. involves a normal-flow microchannel heat sink, which combines the benefits of sub-millimeter scaled channels with vertical flow towards the heated surface. In most microchannel designs, the increased heat transfer is offset by increased pressure losses in the small-scale channels, which results in increased pumping needs. By altering the flow passage geometry to produce flow normal to the heated surface rather than parallel to it, shorter channels are possible, so the pressure loss is not severe. However, the manufacture of this heat sink is somewhat difficult, as micro-channels and larger fluid supply/return passages must be first machined on individual copper laminations, which are then assembled in a stack.

U.S. Pat. No. 6,014,312, Schultz-Harder et al., entitled "Cooler or heat sink for electrical components or circuits and an electrical circuit with this heat sink," also provides an improvement relative to conventional microchannel liquid cooling designs. The device of Schultz-Harder et al. also consists of a stack of copper laminations with overlapping, but slightly offset, millimeter-sized holes, resembling a stack of sliced Swiss cheese. The fluid flow is parallel to the heated surface. The holes introduce additional turbulence in the liquid, enhancing the heat transfer, but also resulting in a higher pressure drop. Device manufacturing requires precise alignment of the laminations before they are bonded together. Based on published thermal performance results, the design of Schultz-Harder et al. is less effective than that of Valenzuela et al, but it is still better than conventional heat sinks.

U.S. Pat. No. 5,692,558, Hamilton et al., entitled "Microchannel cooling using aviation fuels for airborne electronics," describes a micro-channel heat sink for cooling of semiconductor devices with aircraft fuel. The channels are built directly in the device's semiconductor substrate to reduce junction-to-fluid thermal resistance. U.S. Pat. No. 5,998,240, Hamilton et al., entitled "Method of extracting heat from a semiconductor body and forming microchannels therein," (Hamilton II) also discloses forming of microchannels directly in the semiconductor substrate of the radio-frequency (RF) power device. Additionally, Hamilton II discloses a full three-phase inverter with direct cooling of switching power devices (IGBT's and diodes). Although implementation of microchannels directly in the semiconductor device's substrate may be suitable for low-voltage RF applications, it is not practical for the switching power inverter applications. The IGBT and diode power devices for switching inverter applications have vertical structure, and the bottom of the semiconductor substrate is a power terminal (collector/cathode) that connects to other circuit components. The collector/cathode terminal of the switching power device alternatively conducts substantial current (as much as 150A) and blocks voltage that could exceed thousand volts. Implementation of the micro-channels at the bottom of the device would be impractical for several reasons. The implementation would interfere with the electrical interconnect to other circuit components, the implementation would expose cooling fluid to high voltage and put severe restrictions on suitable fluids and/or necessitate de-ionization equipment, and the implementation would exacerbate electromagnetic interference (EMI) problems due to cooling fluid becoming conduction path for high frequency currents.

U.S. Pat. No. 5,727,618, Mundinger et al., entitled "Modular microchannel heat exchanger," describes a microchannel heat sink for cooling a high heat flux laser diode array. The heat sink features micro-channels formed in multiple copper sheets, and practical implementation of the micro-channels requires vertical stacking and brazing of multiple copper sheets to achieve desired (tall) aspect ratio. It also requires stacking and bonding of multiple copper plates with etched geometries for vertical manifolding of cooling fluid from inlet pipe up to the heated surface and back down to the fluid outlet. There are several disadvantages of this design. Manufacturing of the heat sink requires etching, metallization, stacking, precise alignment, and bonding of a number of copper foils in order to achieve sufficient channel depth. The same is true for stacked copper plates that form the inlet and outlet manifolds. Scalability to larger heat sink sizes is limited by fluid manifolding in a vertical direction and it may lead to excessive heat sink thickness. Finally, Mundinger fails to address implementation of electrical isolation between the semiconductor power devices and the cooling fluid.

U.S. Pat. No. 6,131,650, North et al. entitled "Fluid cooled single phase heat sink," describes a heat sink that places a pad of porous metal in contact with the heated surface. One drawback of this approach is that thermal performance of the porous metal pad is less effective.

It would therefore be desirable to provide an apparatus for cooling a heated surface with improved thermal performance, relatively simple assembly to reduce manufacturing cost, and scalability for accommodating small and large power devices as well as different numbers of power devices. In addition, it would be desirable for the apparatus to provide electrical isolation between high power devices and the coolant.

BRIEF DESCRIPTION

An aspect of the present invention resides in an apparatus for cooling at least one heated surface. Briefly, the apparatus includes a base plate defining a number of inlet manifolds and a number of outlet manifolds. The inlet manifolds are configured to receive a coolant, and the outlet manifolds are configured to exhaust the coolant. The inlet and outlet manifolds are interleaved. The apparatus further includes at least one substrate having an inner surface and an outer surface. The inner surface is coupled to the base plate and defines a number of microchannels configured to receive the coolant from the inlet manifolds and to deliver the coolant to the outlet manifolds. The microchannels are oriented substantially perpendicular to the inlet and outlet manifolds. The outer surface is in thermal contact with the heated surface. The apparatus further includes an inlet plenum configured to supply the coolant to the inlet manifolds and an outlet plenum configured to exhaust the coolant from outlet manifolds. The inlet plenum and the outlet plenum are oriented in a plane of the base plate.

DRAWINGS

These and other features, aspects, and advantages of the present invention will become better understood when the following detailed description is read with reference to the accompanying drawings in which like characters represent like parts throughout the drawings, wherein.

Figure 7:
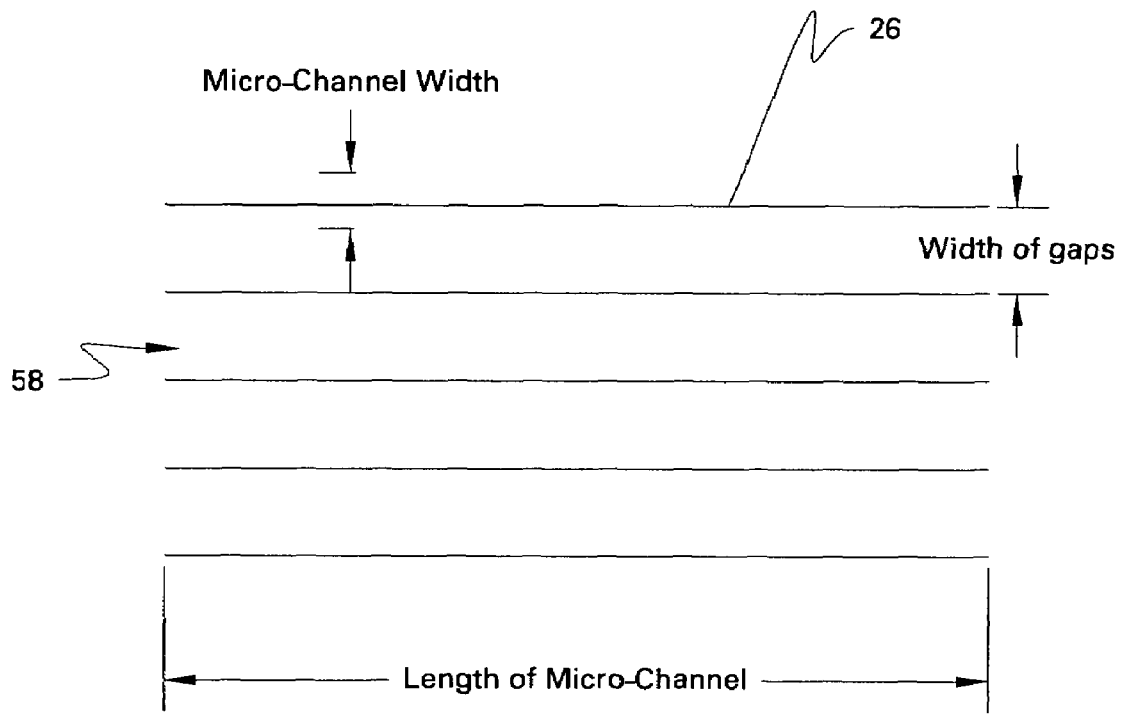
Figure 8:
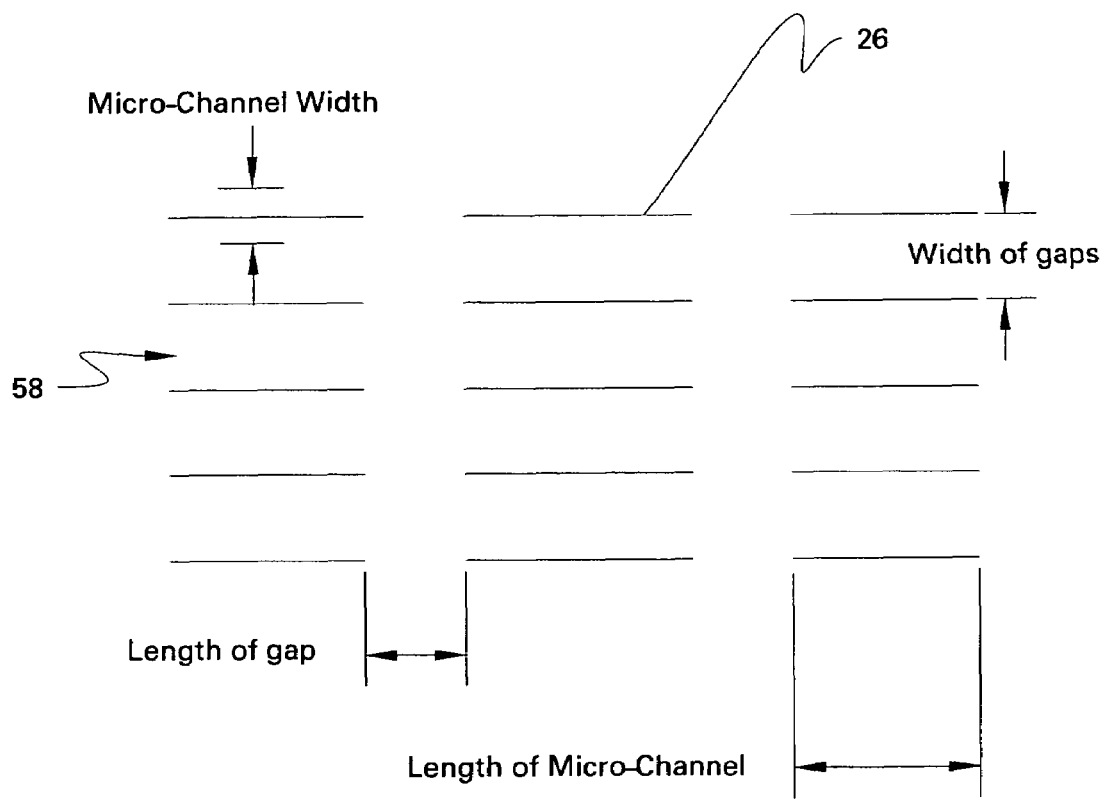
Figure 9:
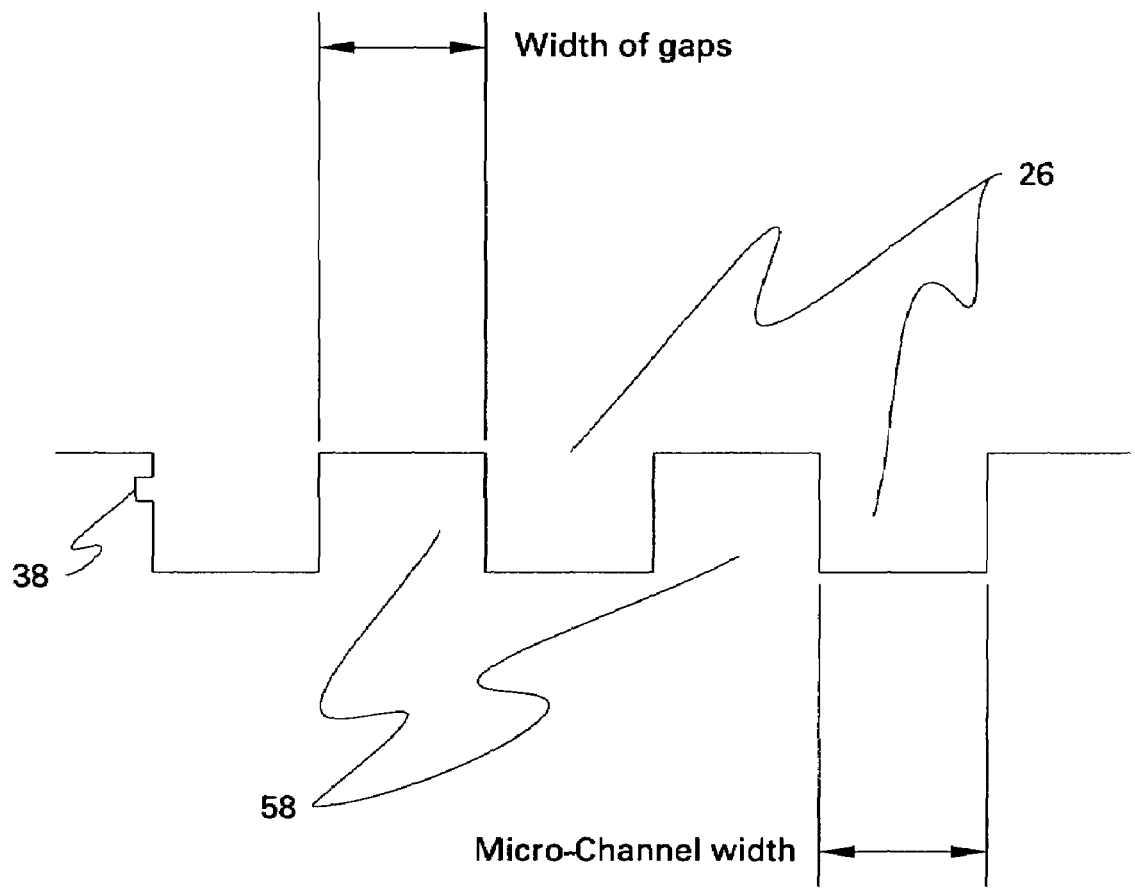
Figure 10:
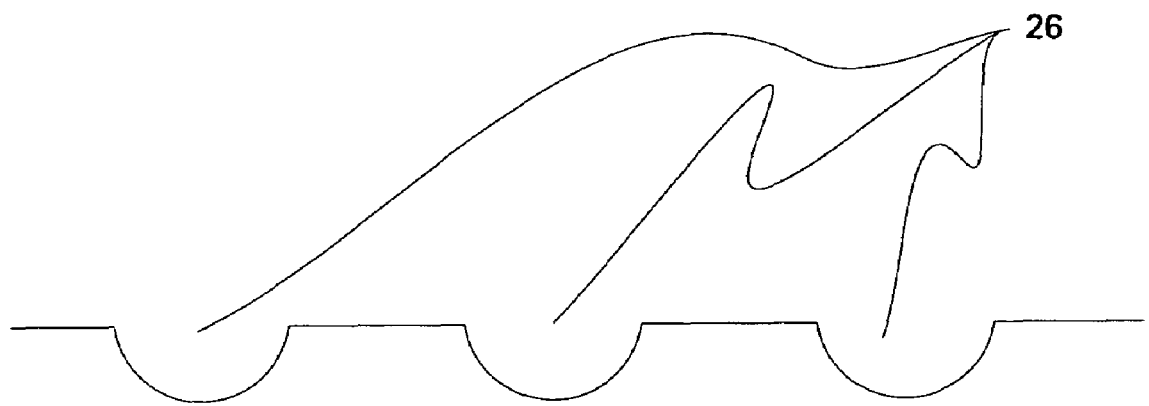
Figure 11:
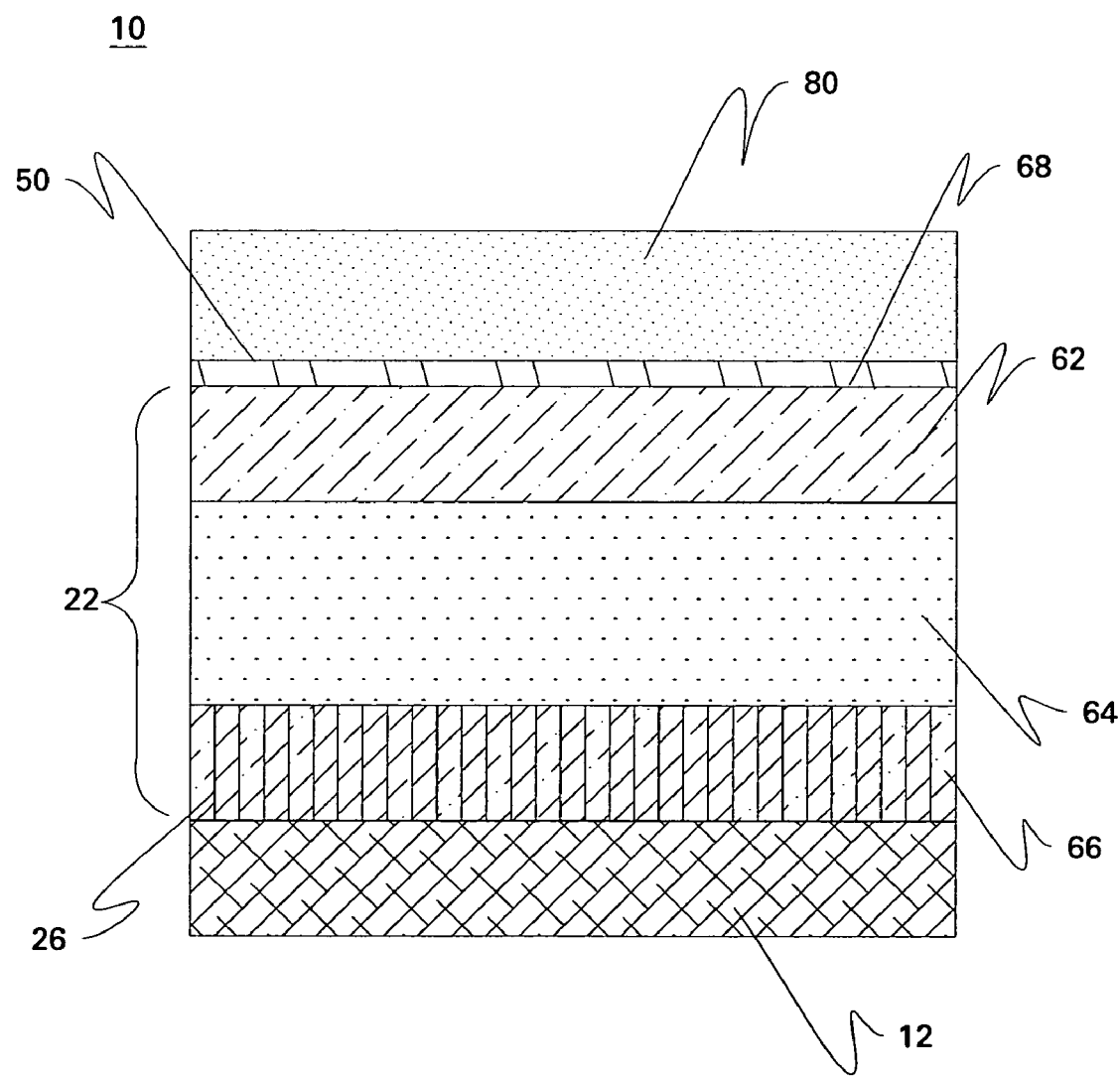
Figure 12:
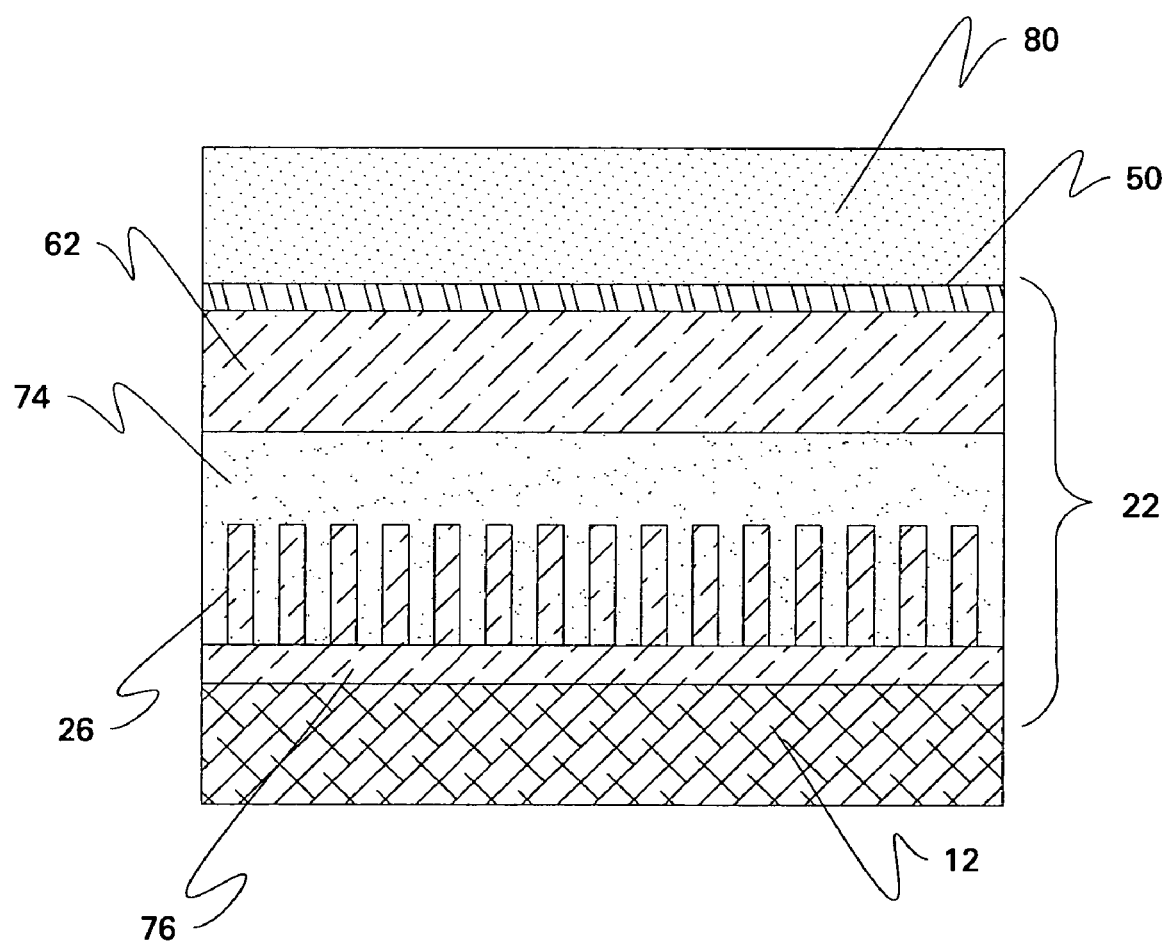
Figure 13:
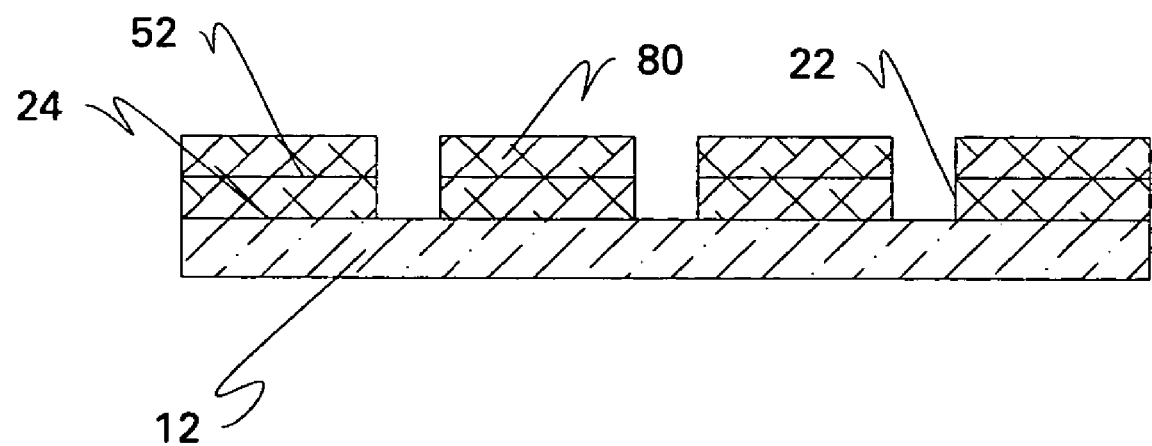
Figure 14:
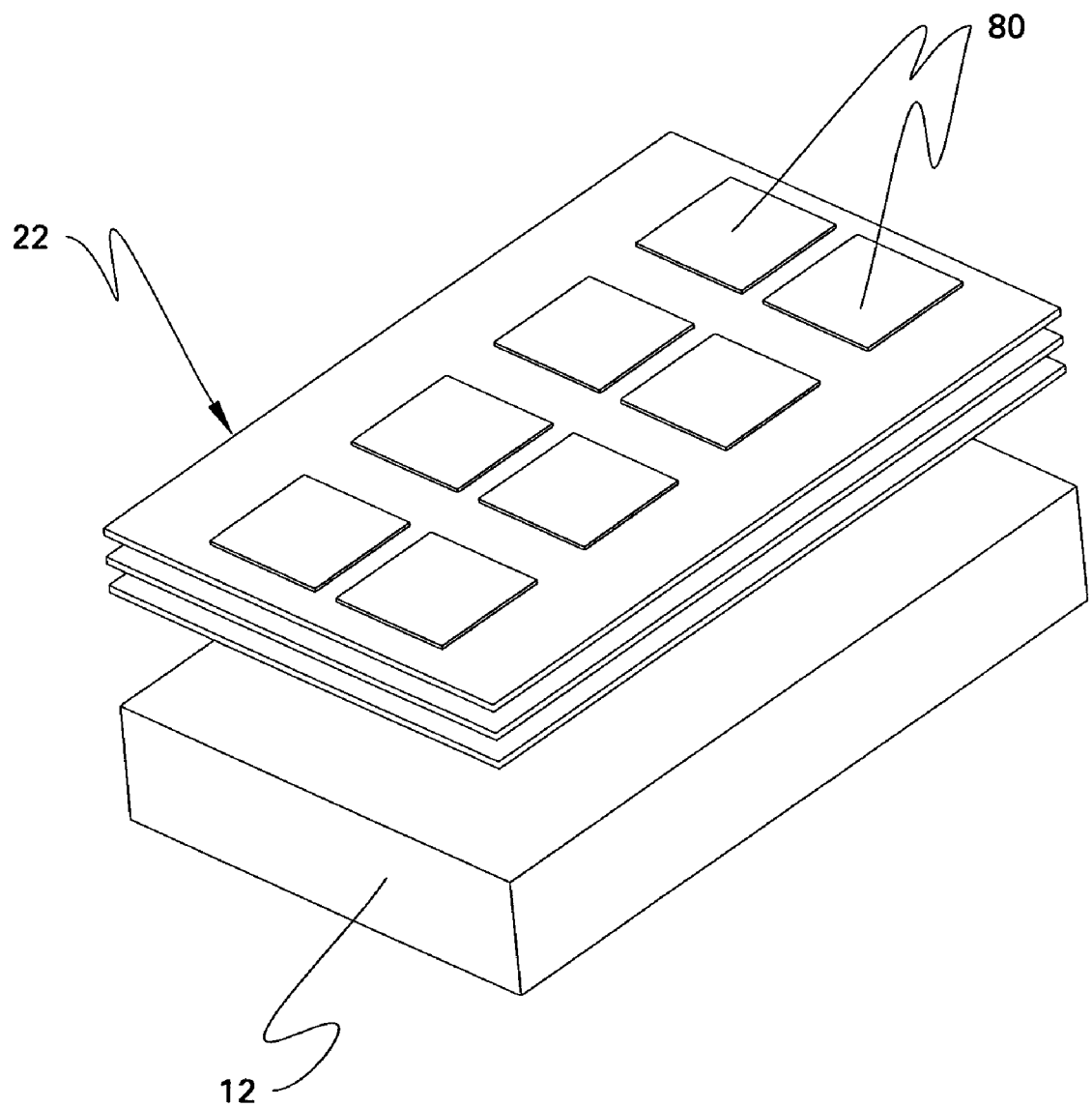
Figure 15:
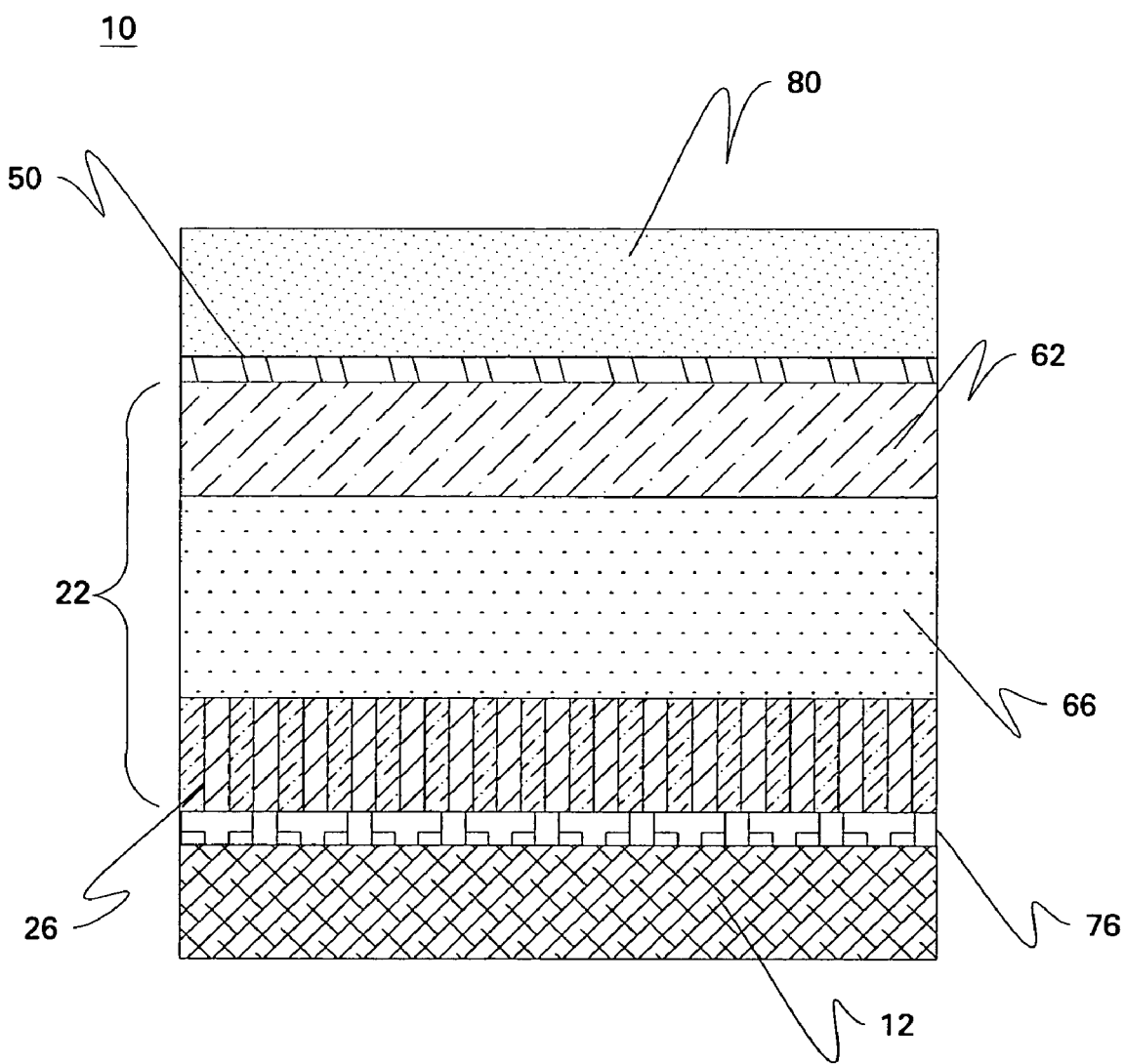

FIG. 7 schematically depicts an exemplary set of microchannels;

FIG. 8 illustrates another exemplary arrangement of microchannels;

FIG. 9 is a cross-sectional view of several microchannels with exemplary rectilinear geometries;

FIG. 10 is a cross-sectional view of several microchannels with exemplary curved geometries;

FIG. 11 depicts, in cross-sectional view, an exemplary heat sink for which the microchannels are formed in the inner surface of the substrate;

FIG. 12 depicts, in cross-sectional view, another exemplary heat sink for which the microchannels are formed in an insulating microchannel layer;

FIG. 13 illustrates, in cross-sectional view, an exemplary multi-substrate embodiment of the heat sink for cooling a number of power devices;

FIG. 14 shows an exemplary single-substrate embodiment of the heat sink for cooling a number of power devices; and FIG. 15 depicts, in cross-sectional view, an exemplary heat sink with no insulating layer for use with low voltage devices.

DETAILED DESCRIPTION

Figure 1:
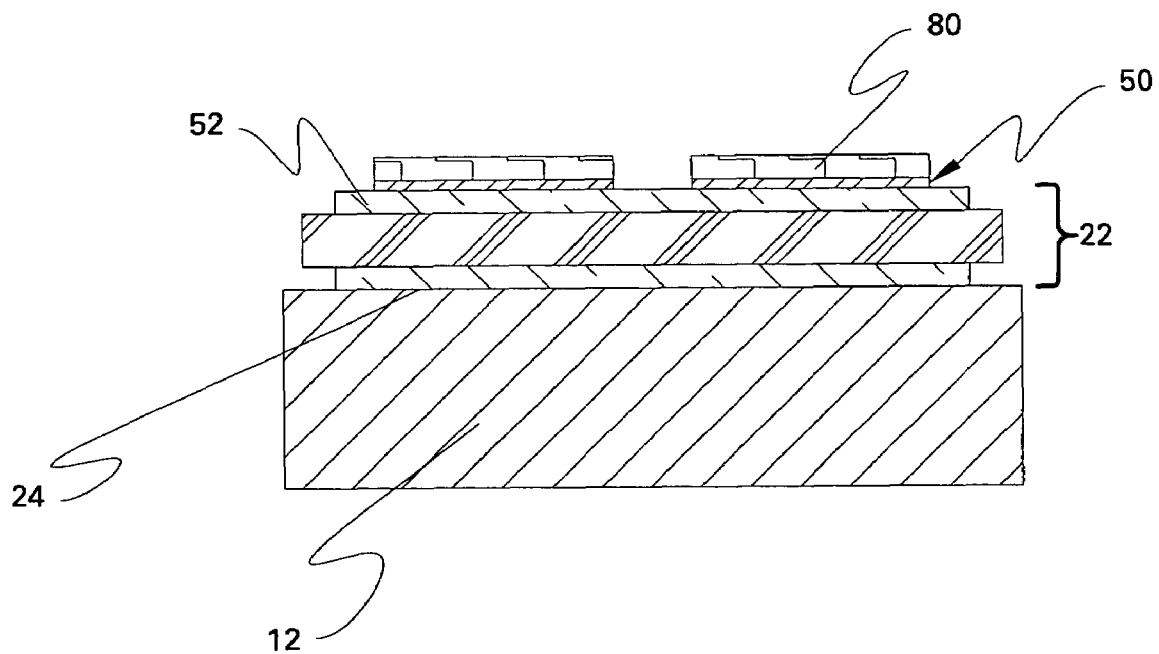
FIG. 1 shows an apparatus for cooling a power device in side view.
Figure 2:
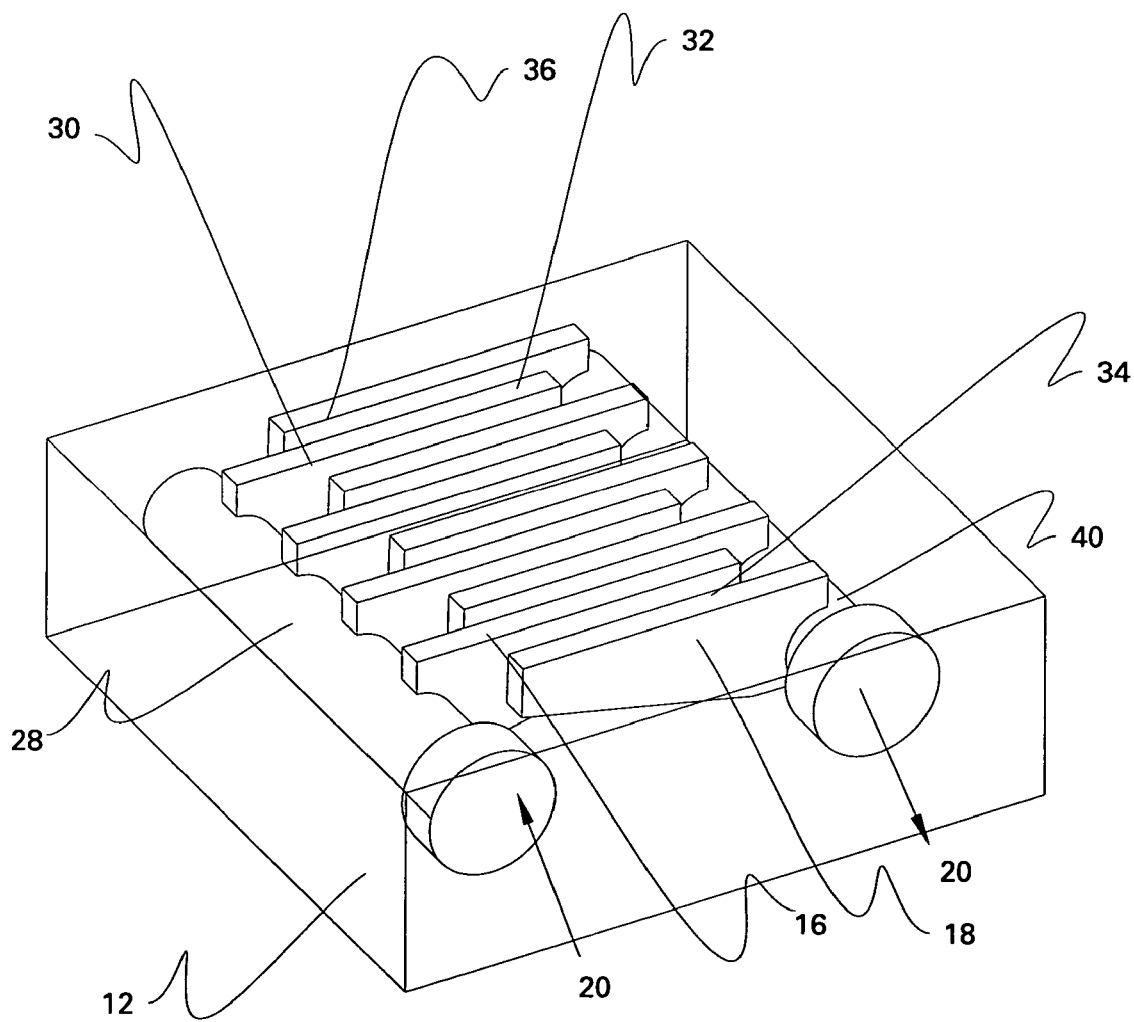
FIG. 2 shows interleaved inlet and outlet manifolds within a base plate of the apparatus of FIG. 1.
Figure 3:
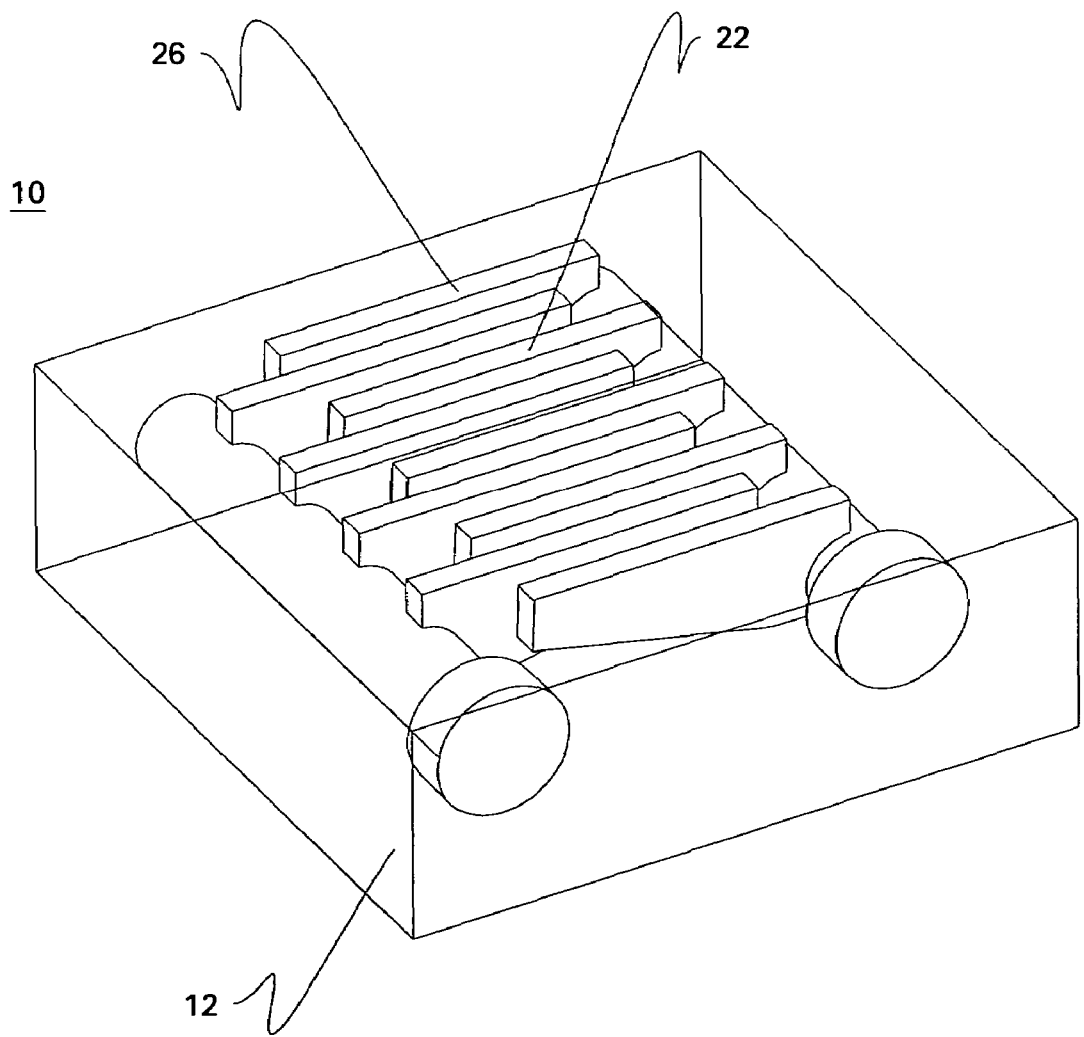
FIG. 3 shows a substrate coupled to the base plate of FIG. 2, where the substrate includes a number of microchannels oriented substantially perpendicular to the inlet and outlet manifolds.
Figure 4:
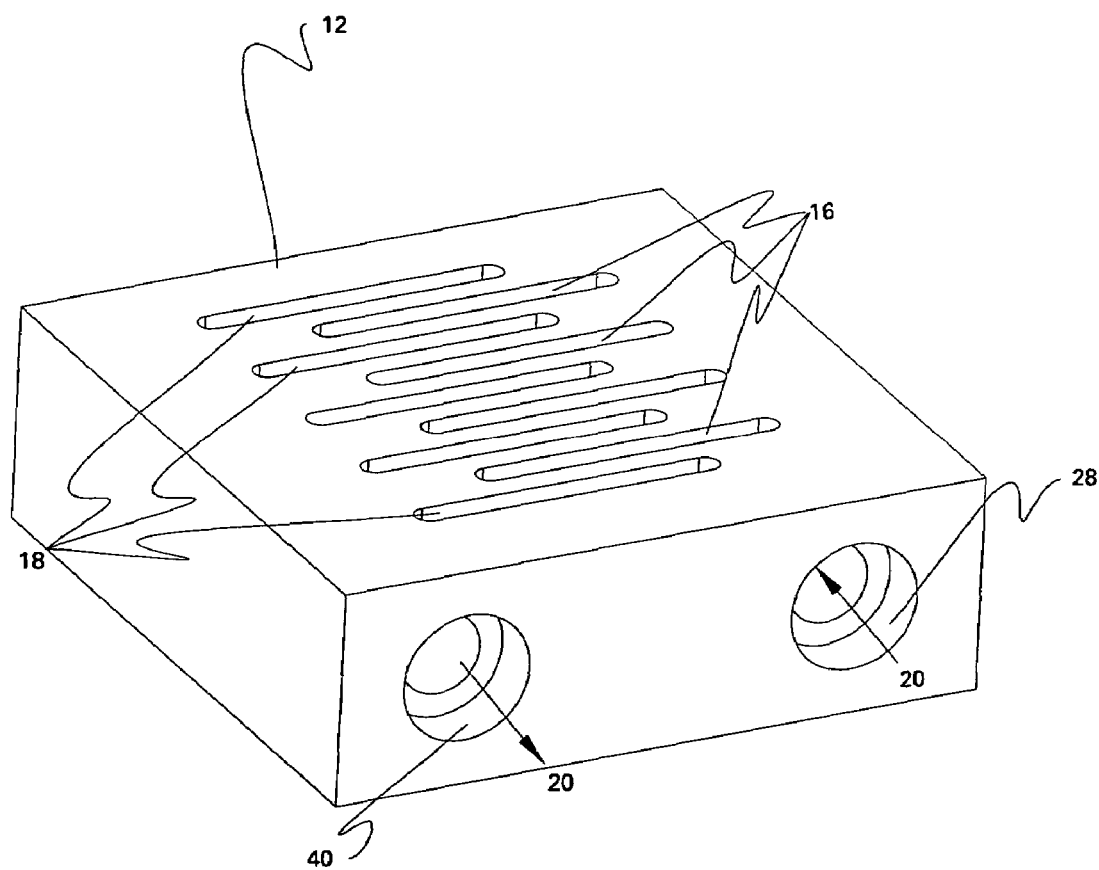
FIG. 4 is another view of the inlet and outlet manifolds formed in the base plate of the heat sink.
Figure 5:
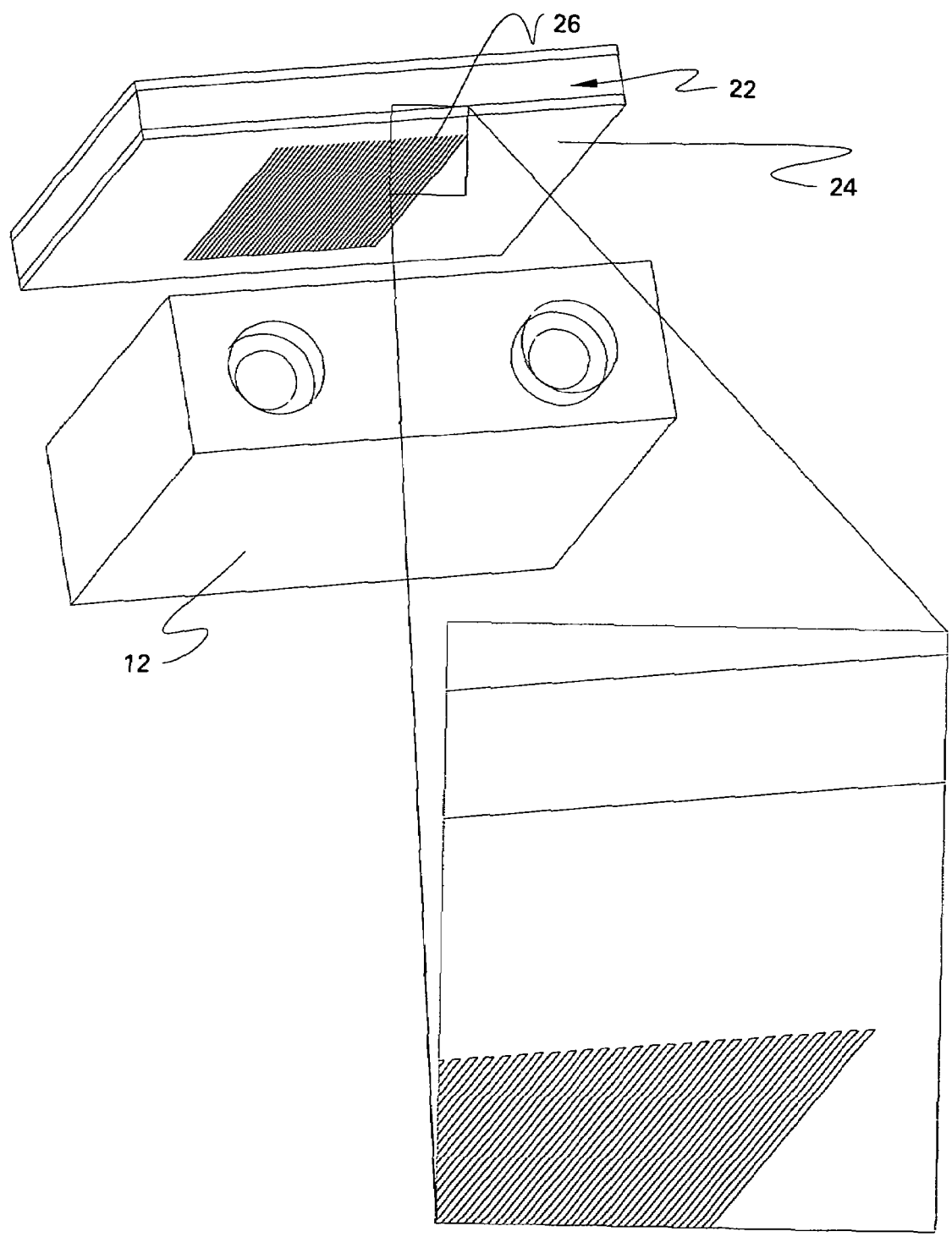
FIG. 5 shows the base plate and substrate in a partially exploded view and includes a detailed view of an exemplary microchannel arrangement.

An apparatus 10 for cooling at least one heated surface 50 is described with reference to FIGS. 1-3 and 5. As shown, for example, in FIG. 1, apparatus 10 includes a base plate 12, which is shown in greater detail in FIG. 2. As shown, for example, in FIG. 2, base plate 12 defines a number of inlet manifolds 16 and a number of outlet manifolds 18. The inlet manifolds 16 are configured to receive a coolant 20, and the outlet manifolds 18 are configured to exhaust the coolant. As indicated in FIG. 2, for example, inlet and outlet manifolds 16, 18 are interleaved. As indicated in FIG. 1, apparatus 10 further includes at least one substrate 22 having a inner surface 24 and an outer surface 52, the inner surface 24 being coupled to base plate 12. As shown for example in FIGS. 3 and 5, the inner surface 24 features a number of microchannels 26 configured to receive the coolant from inlet manifolds 16 and to deliver the coolant to outlet manifolds 18. Microchannels 26 are oriented substantially perpendicular to inlet and outlet manifolds 16, 18, as indicated in FIGS. 3 and 5, for example. The outer surface 52 of substrate 22 is in thermal contact with the heated surface 50, as indicated in FIG. 1. Apparatus 10 further includes an inlet plenum 28 configured to supply the coolant 20 to inlet manifolds 16 and an outlet plenum 40 configured to exhaust the coolant from outlet manifolds 18. As indicated in FIGS. 2 and 3, inlet plenum 28 and outlet plenum 40 are oriented in a plane of base plate 12.

As used herein the phrase "oriented substantially perpendicular" should be understood to mean that the microchannels 26 are oriented at angles of about ninety degrees plus/minus about thirty degrees (90+/−30 degrees) relative to the inlet and outlet manifolds 16, 18. According to a more particular embodiment, the microchannels 26 are oriented at angles of about ninety degrees plus/minus about fifteen degrees (90+/−15 degrees) relative to the inlet and outlet manifolds 16, 18. For angles less than fifteen degrees from perpendicular, the thermal performance is within about eight to about ten percent (8-10%) of the best case. Beyond that point, the heat transfer drops off significantly, reaching about thirty percent (30%) less at angles of about thirty degrees from perpendicular and about 50% less when the microchannels 26 are oriented at an angle of about forty-five degrees relative to the inlet and outlet manifolds 16, 18. In addition, pressure losses can increase by about thirty to about fifty percent (30-50%) when the microchannels 26 and inlet/outlet manifolds 16, 18 are oriented at angles in the range of forty-five to sixty degrees.

Many coolants 20 can be employed for apparatus 10, and the invention is not limited to a particular coolant. Exemplary coolants include water, ethylene-glycol, oil, aircraft fuel and combinations thereof. According to a particular embodiment, the coolant is a single phase liquid. In operation, the coolant enters the manifolds 16 in base plate 12 and flows through microchannels 26 before returning through exhaust manifolds 18. More particularly, coolant enters inlet plenum 28, whose fluid diameter exceeds that of the other channels in apparatus 10, according to a particular embodiment, so that there is no significant pressure-drop in the plenum. For example, the fluid diameter of inlet plenum 28 exceeds that of the other channels by a ratio of about three-to-one (3:1) relative to the manifold hydraulic diameter. For this example, the difference in the pressure drop for a single plenum channel (of equal length) would be of the order of $1/(3^5)=1/243$ of the loss of the loss in the manifold. The coolant exits apparatus 10 through outlet plenum 40.

According to a particular embodiment, base plate 12 comprises a thermally conductive material. Exemplary materials include copper, Kovar, Molybdenum, titanium, ceramics and combinations thereof. The invention is not limited to specific base plate materials.

Figure 6:
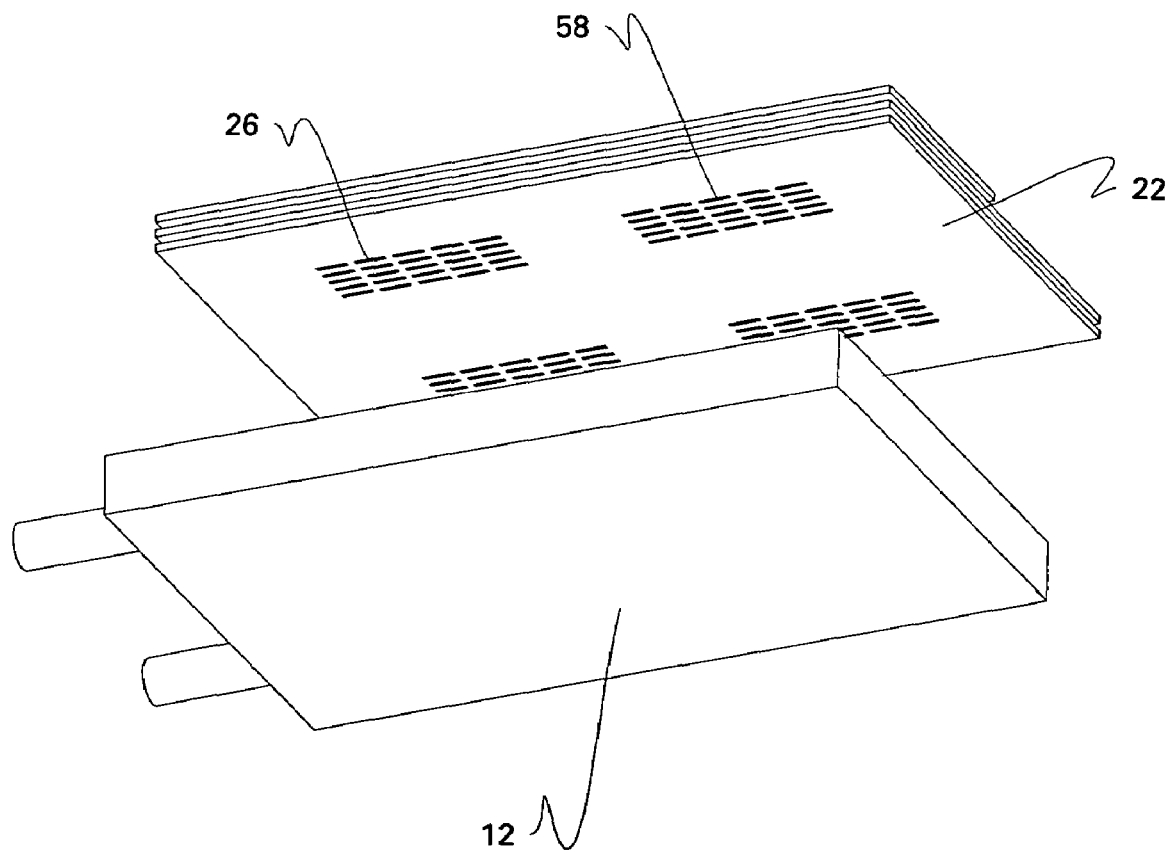
FIG. 6 shows the base plate and substrate in another partially exploded view.

Exemplary microchannel 26 configurations are schematically depicted in FIGS. 5, 6, 7 and 8. For the exemplary embodiment of FIGS. 5 and 7, the microchannel configuration is formed of continuous u-channels extending along the substrate 22. FIGS. 6 and 8 illustrate an alternative arrangement of short microchannels 26 that are separated by gaps. According to a particular embodiment, microchannels 26 are less than about 200 μm wide and are separated by a number of gaps 58 of less than about 200 μm. According to a more particular embodiment, microchannels 26 are about 100 μm wide and gaps 58 are about 100 μm. A computational fluid dynamics (CFD) model of apparatus 10 was developed to select microchannel sizes and shapes to promote efficient thermal performance. Simulation results indicate that microchannel widths and spacing in a range of about 0.05 mm and 0.2 mm demonstrate effective performance. For widths below about 0.05 mm, the pressure loss can increase above 25 psi for water flow rates near one gallon per minute (1 GPM), rendering the design less practical due to pumping requirements. For widths above 0.2 mm, the performance advantages of microchannel geometries start to diminish, and the thermal performance starts to approach that of a conventional heat sink. The simulation results indicate that microchannels 26 of width and spacing of 0.1 mm, yield a temperature rise of around 30° C. with 15 psi pressure losses when cooling a device producing 520 W/cm$^2$ with water flow rate at 1 GPM. Beneficially, by densely packing narrow microchannels 26, the heat transfer surface area is increased, which improves the heat transfer from the heated surface 50.

Microchannels 26 can be formed with a variety of geometries. Exemplary microchannel 26 geometries include rectilinear and curved geometries. The microchannel walls 54 may be smooth as shown in FIG. 9, for example, or may be rough. Rough walls increase surface area and enhance turbulence, increasing the heat transfer in the microchannels. For example, the microchannels may include dimples 38 to further enhance heat transfer. An exemplary dimple 38 is indicated in FIG. 9. In addition, microchannels 26 may be continuous, as indicated for example in FIGS. 5 and 7, or microchannels 26 may form a discrete array 60, as exemplarily shown in FIGS. 6 and 8. According to a specific embodiment, microchannels 26 form a discrete array and are about 1 mm in length and are separated by a gap of less than about 0.5 mm.

In addition to the microchannel design, the inlet and outlet manifold configuration affects the heat transfer effectiveness of apparatus 10. For the exemplary embodiments of FIGS. 2 and 3, each of the inlet manifolds 16 has a wide end 30 and a narrow end 32, with each of the wide ends 30 being larger that the respective narrow end 32. For the illustrated embodiment, the wide ends 30 are relatively deep, on the order of the plenum diameter. More particularly, each of the inlet manifolds 16 is tapered between the respective wide end 30 and narrow end 32, as indicated in FIG. 2. For the illustrated embodiment, each of the inlet manifolds 16 extends from the inlet plenum 28 and is oriented substantially perpendicular to the inlet plenum. According to a particular embodiment, the inlet manifolds are tapered linearly to maintain uniform flow distribution in the microchannels 26, as the mass flow decreases along the inlet manifold 16 through the transmission of fluid into the microchannel passages. Non-uniform flows would result in lower thermal performance, as some microchannels would have lower flow rates and diminished convective heat transfer.

In addition to geometry considerations, dimensional factors also affect thermal performance. CFD simulations were performed to select inlet manifold dimensions for improved thermal performance. To further enhance heat transfer, each of the inlet manifolds 16 has a width in a range of about 0.5 mm to about 2 mm. Below 0.5 mm, the pressure losses in inlet manifolds 16 increased, and the manufacturing tolerances become more difficult to maintain. Above 2 mm, the effective length of the microchannel passages is reduced, resulting in less heat-transfer surface. According to a particular embodiment, the inlet manifolds 16 are about 1 mm in width, which represents a good trade-off between thermal performance and manufacturing simplicity. Beneficially, these manifold geometries and dimensions are selected to reduce temperature gradients and pressure drops. In addition, the narrow ends 32 of the inlet manifolds 16 are plugged, so that coolant 20 cannot pass directly between the inlet and outlet plenum, but rather must pass through microchannels 26, according to a particular embodiment.

For the exemplary embodiments of FIGS. 2 and 3, each of the outlet manifolds 18 has a wide end 34 and a narrow end 36, with each of the wide ends 34 being larger than the respective narrow end 36. For the illustrated embodiment, the wide ends 34 are relatively deep, on the order of the plenum diameter. More particularly, each of the outlet manifolds 18 is tapered between the respective wide ends 34 and narrow ends 36, as indicated in FIG. 2. For the illustrated embodiment, each of the outlet manifolds 18 extends from the outlet plenum 40 and is oriented substantially perpendicular to outlet plenum 40. According to a particular embodiment, the outlet manifolds are tapered linearly to maintain uniform flow distribution in the microchannels 26. Based on CFD simulations, exemplary dimensions of outlet manifolds 18 have been selected. To further enhance heat transfer, each of the outlet manifolds 18 has a width in a range of about 0.5 mm to about 2 mm. According to a particular embodiment, each of outlet manifolds 18 is about one millimeter (1 mm) wide. In addition, the outlet narrow ends 36 are plugged, so that coolant 20 cannot pass directly between the inlet and outlet plenum, but rather must pass through microchannels 26, according to a particular embodiment.

For the exemplary embodiment of FIG. 2, there is one more outlet manifold 18 (N+1) than inlet manifold 16 (N), in order to preserve the symmetry of the coolant flow. For another embodiment, there are N outlet manifolds 18 and N+1 inlet manifolds 16. For the exemplary embodiments of FIGS. 2 and 3, inlet plenum 28 and outlet plenum 40 are substantially uniform in cross-section. According to another embodiment, inlet plenum 28 and outlet plenum 40 are tapered. Along with tapering inlet and outlet manifolds 16, 18 inlet plenum 28 and outlet plenum 40 may be similarly augmented to provide uniform flow into the manifolds. Although the relatively small heat sinks illustrated in FIGS. 2 and 3 do not have plenum tapering due to the relatively small number of manifolds, in larger heat sinks 10, the tapering of inlet and outlet plenums can be beneficial. According to a particular embodiment, inlet and outlet plenum 28, 40 are tapered and have trapezoidal prism shapes.

For the exemplary embodiments of FIGS. 11 and 12, substrate 22 includes at least one thermally conductive material and at least one electrically isolating material. According to particular embodiments, substrate 22 is formed of either a direct bonded copper (DBC), or an active metal braze (AMB) structure. DBC and AMB refer to processes by which copper layers are directly bonded to a ceramic substrate. Exemplary ceramic bases include aluminum-oxide ($AL_2O_3$), aluminum nitride (AlN), berilium oxide (BeO) and silicon nitride ($Si_3N_4$). Both DBC and AMB are convenient structures for substrate 22, and the use of the same conductive material (in this case, copper) on both sides of the ceramic base provides thermal and mechanical stability. Of course, substrate 22 can be constructed from other materials, such as gold or silver. Beneficially, the substrate 22 can be attached to base plate 12 using any one of a number of techniques, including brazing, bonding, diffusion bonding, soldering, or pressure contact such as clamping. This provides a simple assembly process, which reduces the overall cost of the heat sink 10. Moreover, by attaching the substrate 22 to base plate 12, fluid passages are formed under the heated surfaces 50, enabling practical and cost-effective implementation of the microchannel cooling technology.

For the exemplary embodiment illustrated in FIG. 11, substrate 22 includes a top layer 62, an insulating layer 64 and an inner layer 66. For this embodiment, microchannels 26 are formed in the inner layer 66, and insulating layer 64 is disposed between top layer 62 and inner layer 66. The inner layer 66 is attached to base plate 12, and top layer 62 is coupled to the heated surface 50. For example, the inner layer 66 is attached to the base plate 12 by brazing, bonding, diffusion bonding, soldering, pressure contact such as clamping or other attachment means. For the exemplary embodiment of FIG. 11, the heated surface 50 is coupled to the top layer 62 by solder 68, as shown. For the exemplary embodiment depicted in FIG. 11, microchannels 26 extend through the inner layer 66. In other words, the microchannel depth is equal to the thickness of the inner layer 66. CFD modeling results demonstrated improved performance for tall, high-aspect ratio microchannels, such as those shown in FIG. 11. For a typical thickness of the inner layer of a substrate, the microchannels in FIG. 11 would be about 0.3 mm tall. Of course other implementations are possible, and for an alternative embodiment (not shown) the microchannels 26 do not extend through the thickness of the inner layer 66, thereby isolating the insulating layer 64 from the coolant 20, which flows through microchannels 26. Beneficially, the ceramic layer 64 provides electrical isolation between the coolant and the power devices 80 mounted atop substrate 22. According to a particular embodiment, top layer 62 and inner layer 66 are formed of copper (Cu), and insulating layer 64 is a ceramic selected from the group consisting of AlN, $Al_2O_3$, $Si_3Ni_4$, BeO or combinations thereof. According to a more particular embodiment, the microchannels 26 are formed in the copper layer 66 on the underside of a substrate 22.

For the exemplary embodiment illustrated in FIG. 12, substrate 22 includes a top layer 62 and an insulating microchannel layer 74, and microchannels 26 are formed in insulating microchannel layer 74. As shown, the insulating microchannel layer 74 is disposed between top layer 62 and base plate 12, and the top layer 62 is coupled to the heated surface 50. As shown in FIG. 12, the microchannels 26 do not extend through insulating microchannel layer 74, in order to isolate the coolant 20 from the heated surface 50 of the power device 80. More particularly, the remaining ceramic layer acts as a dielectric barrier between power devices 80 atop substrate 22 and the coolant 20. Beneficially, while maintaining electrical isolation, this embodiment also eliminates the thickness of material between the power devices 80 and the coolant, resulting in improved thermal performance. According to a more particular embodiment, substrate 22 further includes a lower layer 76 disposed between and attached to insulating microchannel layer 74 and base plate 12, as shown for example in FIG. 12. Exemplary materials for the lower layer 76 include copper.

Another embodiment is shown in FIG. 15. For this embodiment, substrate 22 has an inner layer 66, and microchannels 26 are formed in and extend partially through the inner layer 66. This embodiment is adapted for use with low voltage devices such as laser diodes, RF power devices and computer chips. For this embodiment, the substrate 22 may further include a top layer 62 and a lower layer 76.

According to a particular embodiment, apparatus 10 is adapted for cooling a number of heated surfaces 50. For this embodiment, which is exemplarily illustrated in FIG. 13, apparatus 10 further includes a number of substrates 22. Each of the substrates 22 has an inner surface 24 and an outer surface 52. As indicated, each of the inner surfaces 24 is coupled to a respective portion of the base plate 12, and each of the inner surfaces 24 defines a number of microchannels 26 (not shown in FIG. 13). Each of the outer surfaces 52 is in thermal contact with a respective one of the heated surfaces 50. In large modules, the use of several smaller substrates reduces stresses due to CTE (coefficient of thermal expansion) mismatch.

FIG. 14 illustrates another exemplary embodiment, in which apparatus 10 is also adapted for cooling a number of heated surfaces 50. For the exemplary embodiment depicted in FIG. 14, apparatus 10 includes only one substrate 22, and a number of power devices 80 are mounted on substrate 22, such that apparatus 10 cools the heated surfaces 50 of the power devices 80.

An exemplary heat sink 10 embodiment is described with reference to FIGS. 1-6. Heat sink 10 is used for cooling at least one power device 80 and includes a base plate 12 defining a number of interleaved inlet and outlet manifolds 16, 18, as shown for example in FIG. 2. Heat sink 10 further includes at least one substrate 22 having an inner surface 24 and an outer surface 52. As shown for example in FIGS. 3, 5 and 6, inner surface 24 is coupled to base plate 12 and defines a number of microchannels 26 configured to receive the coolant from inlet manifolds 16 and to deliver the coolant to outlet manifolds 18. As indicated in FIGS. 3 and 5, for example, microchannels 26 are oriented substantially perpendicular to inlet and outlet manifolds 16, 18. Outer surface 52 is in thermal contact with the power device 80, as indicated in FIG. 1, for example. Heat sink 10 further includes an inlet plenum 28 configured to supply the coolant to inlet manifolds, and each of the inlet manifolds extends from the inlet plenum. An outlet plenum 40 is configured to exhaust the coolant from the outlet manifolds, and each of the outlet manifolds extends from the outlet plenum. As shown for example in FIG. 2, the inlet plenum and outlet plenum are oriented in a plane of the base plate 12.

Exemplary power devices include Insulated Gate Bipolar Transistors (IGBT), Metal Oxide Semiconductor Field Effect Transistors (MOSFET), Diodes, Metal Semiconductor Field Effect Transistors (MESFET), and High Electron Mobility Transistors (HEMT). Those skilled in the art will recognize that these are examples of power devices and that the invention is by no means limited to these examples. Rather, heat sink 10 may be used to cool one or more of these or other power devices.

One particular benefit of the present invention is its scalability for cooling of relatively small and large heated surfaces. This advantage is particularly relevant for cooling high power multichip modules.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An apparatus for cooling at least one heated surface, said apparatus comprising:
   a base plate defining a plurality of inlet manifolds and a plurality of outlet manifolds, wherein said inlet manifolds are configured to receive a coolant and said outlet manifolds are configured to exhaust the coolant, and wherein said inlet and outlet manifolds are interleaved and are oriented in a plane of the base plate;
   at least one substrate having an inner surface and an outer surface, wherein said inner surface is coupled to said base plate, wherein said inner surface defines a plurality of microchannels configured to receive the coolant from said inlet manifolds and to deliver the coolant to said outlet manifolds, wherein said microchannels are oriented substantially perpendicular to said inlet and outlet manifolds, and wherein said outer surface is in thermal contact with the heated surface;
   an inlet plenum configured to supply the coolant to said inlet manifolds; and
   an outlet plenum configured to exhaust the coolant from said outlet manifolds, wherein said inlet plenum and said outlet plenum are oriented in the plane of said base plate,
wherein said substrate comprises a top metal layer, an insulating microchannel layer and a lower layer, wherein said microchannels are formed in said insulating microchannel layer, wherein said insulating microchannel layer is disposed between said top metal layer and said base plate, wherein said lower layer is disposed between and attached to said insulating microchannel layer and said base plate, and wherein said top metal layer is coupled to the heated surface.

2. The apparatus of claim 1 wherein said microchannels are less than about 200 μm wide and are separated by a plurality of gaps of less than about 200 μm.

3. The apparatus of claim 2, wherein said microchannels are about 100 μm wide and wherein said gaps are about 100 μm.

4. The apparatus of claim 3, wherein each of said inlet manifolds is about one millimeter (1 mm) wide.

5. The apparatus of claim 1, wherein said microchannels have a rectilinear geometry.

6. The apparatus of claim 1, wherein said microchannels have a curved geometry.

7. The apparatus of claim 1, wherein said microchannels comprise rough walls.

8. The apparatus of claim 1, wherein said microchannels are continuous.

9. The apparatus of claim 1, wherein said microchannels form a discrete array.

10. The apparatus of claim 9, wherein said microchannels are about 1 mm in length and are separated by a gap of less than about 0.5 mm.

11. The apparatus of claim 1, wherein each of said inlet manifolds comprises a wide end and a narrow end, and wherein each of said wide ends is larger that the respective one of said narrow ends.

12. The apparatus of claim 11, wherein each of said inlet manifolds is tapered between the respective ones of said wide ends and said narrow ends.

13. The apparatus of claim 12, wherein each of said inlet manifolds extends from said inlet plenum and is oriented substantially perpendicular to said inlet plenum.

14. The apparatus of claim 13, wherein each of said inlet manifolds has a width in a range of about 0.5 mm to about 2 mm.

15. The apparatus of claim 1, wherein each of said outlet manifolds comprises a wide end and a narrow end, and wherein each of said wide ends is larger that the respective one of said narrow ends.

16. The apparatus of claim 15, wherein each of said outlet manifolds is tapered between the respective ones of said wide ends and said narrow ends.

17. The apparatus of claim 16, wherein each of said outlet manifolds extends from said outlet plenum and is oriented substantially perpendicular to said outlet plenum.

18. The apparatus of claim 17, wherein each of said outlet manifolds has a width in a range of about 0.5 mm to about 2 mm.

19. The apparatus of claim 18, wherein each of said outlet manifolds is about one millimeter (1 mm) wide.

20. The apparatus of claim 1, wherein there are N inlet manifolds and N+1 outlet manifolds.

21. The apparatus of claim 1, wherein said inlet plenum and said outlet plenum are substantially uniform in cross-section.

22. The apparatus of claim 1, wherein the coolant is selected from the group consisting of water, ethylene-glycol, oil, aircraft fuel and combinations thereof.

23. The apparatus of claim 1, wherein the coolant is a single phase liquid.

24. The apparatus of claim 1, wherein said base plate comprises a thermally conductive material.

25. The apparatus of claim 24, wherein said substrate comprises at least one thermally conductive material.

26. The apparatus of claim 25, wherein said substrate comprises at least one electrically isolating material.

27. A heat sink for cooling at least one power device, said heat sink comprising:
   a base plate defining a plurality of inlet manifolds and a plurality of outlet manifolds, wherein said inlet manifolds are configured to receive a coolant and said outlet manifolds are configured to exhaust the coolant, and wherein said inlet and outlet manifolds are interleaved and are oriented in a plane of the base plate, wherein each of said inlet manifolds is tapered and comprises a wide end and a narrow end, wherein each of said wide ends is larger that the respective one of said narrow ends, wherein each of said outlet manifolds is tapered and comprises a wide end and a narrow end, and wherein each of said wide ends is larger that the respective one of said narrow ends;
   at least one substrate having an inner surface and an outer surface, wherein said inner surface is coupled to said base plate, wherein said inner surface defines a plurality of microchannels configured to receive the coolant from said inlet manifolds and to deliver the coolant to said outlet manifolds, wherein said microchannels are oriented substantially perpendicular to said inlet and outlet manifolds, and wherein said outer surface is in thermal contact with the power device;

an inlet plenum configured to supply the coolant to said inlet manifolds, wherein each of said inlet manifolds extends from said inlet plenum; and an outlet plenum configured to exhaust the coolant from said outlet manifolds, wherein each of said outlet manifolds extends from said outlet plenum, and wherein said inlet plenum and said outlet plenum are oriented in the plane of said base plate, wherein said substrate comprises a top metal layer, an insulating microchannel layer and a lower layer, wherein said microchannels are formed in said insulating microchannel layer, wherein said insulating microchannel layer is disposed between said top metal layer and said base plate, wherein said lower layer is disposed between and attached to said insulating microchannel layer and said base plate, and wherein said top metal layer is coupled to the power device.

28. The heat sink of claim 27, wherein each of said inlet manifolds is oriented substantially perpendicular to said inlet plenum, and wherein each of said outlet manifolds is oriented substantially perpendicular to said outlet plenum.

29. The heat sink of claim 28, wherein there are N inlet manifolds and N+1 outlet manifolds.

30. The heat sink of claim 27, wherein said microchannels are continuous.

31. The heat sink of claim 27, wherein said microchannels form a discrete array, and wherein said microchannels are about 1 mm in length and are separated by a gap of less than about 0.5 mm.

* * * * *